US009666575B2

(12) United States Patent
Song et al.

(10) Patent No.: US 9,666,575 B2
(45) Date of Patent: May 30, 2017

(54) SEMICONDUCTOR ARRANGEMENT FACILITATING ENHANCED THERMO-CONDUCTION

(71) Applicant: Taiwan Semiconductor Manufacturing Company Limited, Hsin-Chu (TW)

(72) Inventors: Ming-Hsiang Song, Shin-Chu (TW); Jam-Wem Lee, Hsinchu (TW); Yi-Feng Chang, Xinbei (TW); Wun-Jie Lin, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 14/983,641

(22) Filed: Dec. 30, 2015

(65) Prior Publication Data
US 2016/0133619 A1 May 12, 2016

Related U.S. Application Data

(62) Division of application No. 14/079,744, filed on Nov. 14, 2013, now Pat. No. 9,230,961.

(51) Int. Cl.
*H01L 27/02* (2006.01)
*H01L 27/088* (2006.01)
(Continued)

(52) U.S. Cl.
CPC .... *H01L 27/0251* (2013.01); *H01L 21/26513* (2013.01); *H01L 21/823437* (2013.01);
(Continued)

(58) Field of Classification Search
CPC ......... H01L 27/0255; H01L 21/823871; H01L 27/0207; H01L 21/823828; H01L 27/088;
(Continued)

(56) References Cited

U.S. PATENT DOCUMENTS

| 6,168,984 B1* | 1/2001 | Yoo .................. H01L 27/10888 257/E21.013 |
| 2001/0023954 A1* | 9/2001 | Lee ........................ H01L 27/115 257/296 |

(Continued)

OTHER PUBLICATIONS

Corresponding Chinese application No. 201410032858.6, Chinese Office action dated Feb. 3, 2017, 9 pages.

*Primary Examiner* — Michael Jung
*Assistant Examiner* — Mikka Liu
(74) *Attorney, Agent, or Firm* — Cooper Legal Group, LLC

(57) ABSTRACT

A semiconductor arrangement includes a well region and a first region disposed within the well region. The first region includes a first conductivity type. The semiconductor arrangement includes a first gate disposed above the well region on a first side of the first region. The first gate includes a first top surface facing away from the well region. The first top surface has a first top surface area. The semiconductor arrangement includes a first gate contact disposed above the first gate. The first gate contact includes a first bottom surface facing towards the well region. The first bottom surface has a first bottom surface area. The first bottom surface area covers at least about two thirds of the first top surface area.

20 Claims, 13 Drawing Sheets

(51) Int. Cl.
*H01L 29/66* (2006.01)
*H01L 21/8234* (2006.01)
*H01L 21/265* (2006.01)
*H01L 21/8238* (2006.01)
*H01L 27/092* (2006.01)

(52) U.S. Cl.
CPC ........ *H01L 21/823493* (2013.01); *H01L 21/823828* (2013.01); *H01L 21/823871* (2013.01); *H01L 21/823892* (2013.01); *H01L 27/0207* (2013.01); *H01L 27/088* (2013.01); *H01L 27/0928* (2013.01); *H01L 29/66477* (2013.01)

(58) Field of Classification Search
CPC ......... H01L 27/0251; H01L 21/823437; H01L 21/823493; H01L 29/66477
See application file for complete search history.

(56) References Cited

U.S. PATENT DOCUMENTS

| | | | |
|---|---|---|---|
| 2006/0107246 A1 | 5/2006 | Nakamura | |
| 2012/0211832 A1* | 8/2012 | Chu | H01L 29/402 |
| | | | 257/335 |

* cited by examiner

SEMICONDUCTOR ARRANGEMENT FACILITATING ENHANCED THERMO-CONDUCTION

RELATED APPLICATION

This application is a divisional of and claims priority to U.S. patent application Ser. No. 14/079,744, titled "SEMICONDUCTOR ARRANGEMENT FACILITATING ENHANCED THERMO-CONDUCTION" and filed on Nov. 14, 2013, which is incorporated herein by reference.

BACKGROUND

High voltages can develop in the vicinity of an integrated circuit due to the buildup of electrostatic charges. When the electrostatic charges are discharged, a current is produced at nodes of the integrated circuit, thus causing an electrostatic discharge (ESD). During ESD, current flowing through the integrated circuit generates heat.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques, and resulting structures, for fabricating a semiconductor arrangement are provided herein.

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1A:
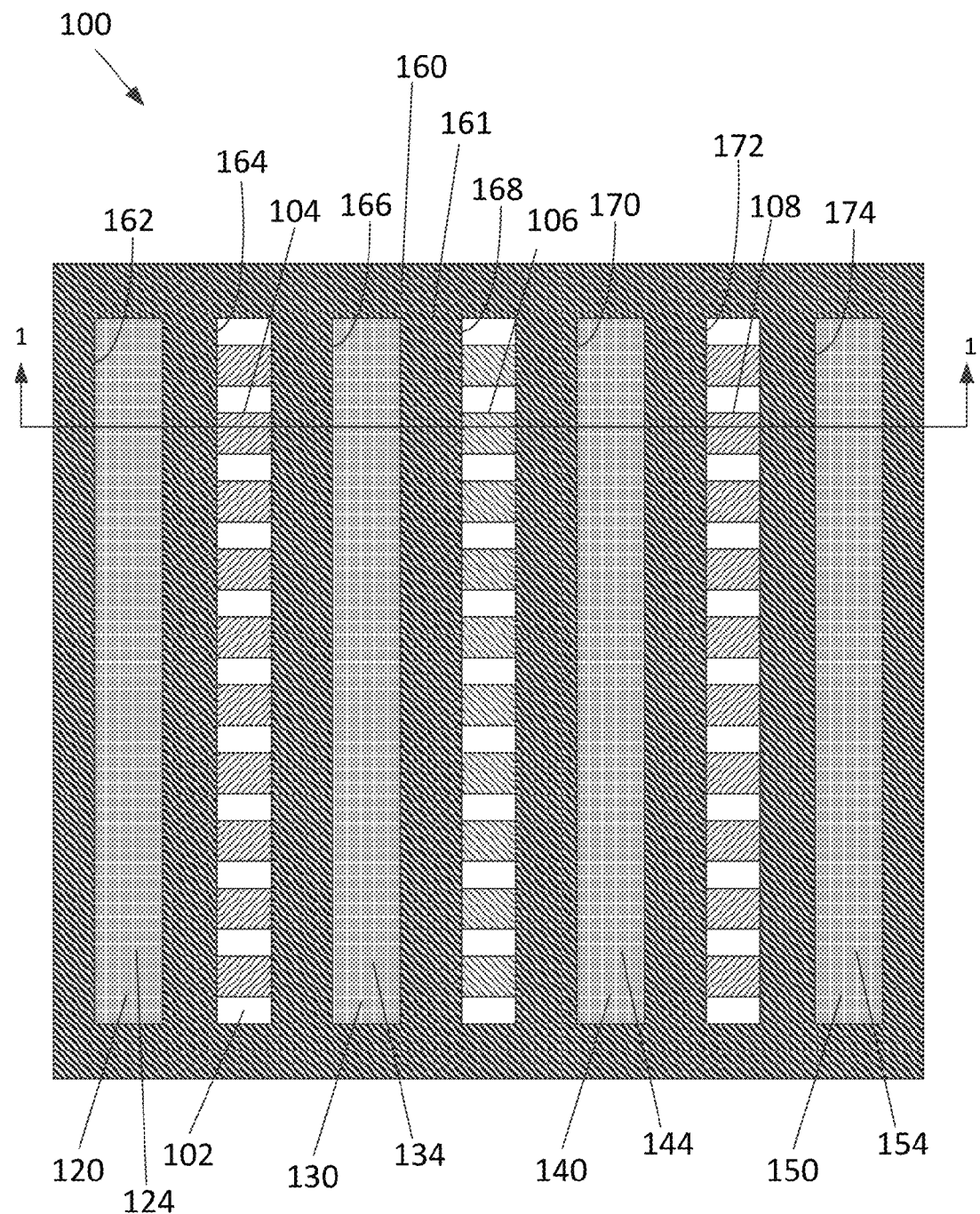
FIG. 1a illustrates a portion of a semiconductor arrangement, according to an embodiment.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more techniques for fabricating a semiconductor arrangement and resulting structures formed thereby are provided herein.

Figure 1B:
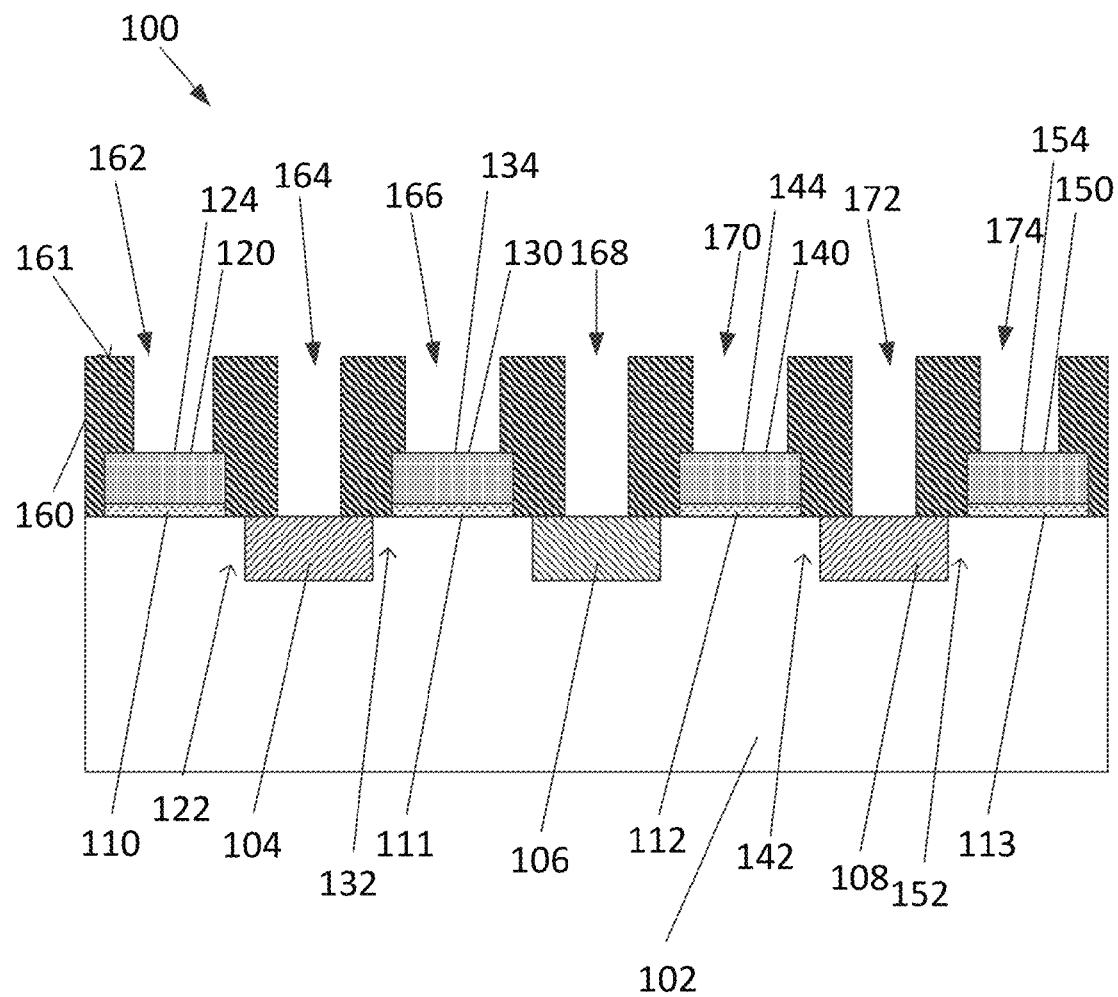
FIG. 1b illustrates a portion of a semiconductor arrangement, according to an embodiment.

FIG. 1a is a plan view illustrating a semiconductor arrangement 100 according to some embodiments. FIG. 1b is a cross-sectional view illustrating the embodiment of FIG. 1a along line 1-1. In an embodiment, the semiconductor arrangement 100 includes a well region 102. According to some embodiments, the well region 102 comprises a first conductivity type. In some embodiments, the first conductivity type comprises a p-type, such that the well region 102 comprises a p-well. In some embodiments, the first conductivity type of the well region 102 comprises an n-type such that the well region 102 comprises an n-well.

In an embodiment, the semiconductor arrangement 100 comprises a first region 104. According to some embodiments, the first region 104 is disposed within the well region 102. In an embodiment, the first region 104 is implanted in the well region 102. In an embodiment, the first region 104 comprises a first conductivity type. In some embodiments, the first conductivity type comprises a p-type. In some embodiments, the first conductivity type comprises an n-type. In some embodiments, the first conductivity type comprises a p+ type. In some embodiments, the first conductivity type comprises an n+ type. According to some embodiments, the first region 104 comprises a source region. According to some embodiments, the first region 104 comprises a drain region.

In an embodiment, the semiconductor arrangement 100 comprises a second region 106. According to some embodiments, the second region 106 is disposed within the well region 102. In an embodiment, the second region 106 is implanted in the well region 102. In an embodiment, the second region 106 comprises a second conductivity type. In some embodiments, the second conductivity type comprises a p-type. In some embodiments, the second conductivity type comprises an n-type. In some embodiments, the second conductivity type comprises a p+ type. In some embodiments, the second conductivity type comprises an n+ type. According to some embodiments, the second region 106 comprises an opposite conductivity type than the first region 104. According to some embodiments, the second region 106 comprises a source region. According to some embodiments, the second region 106 comprises a drain region.

In an embodiment, the semiconductor arrangement 100 comprises a third region 108. According to some embodiments, the third region 108 is disposed within the well region 102. In an embodiment, the third region 108 is implanted in the well region 102. In an embodiment, the third region 108 comprises the first conductivity type. According to some embodiments, the third region 108 comprises an opposite conductivity type than the second region 106. In some embodiments, if the second region 106 comprises a P+ conductivity type, the first region 104 and the third region 108 comprise an N+ conductivity type. In some embodiments, if the second region 106 comprises an N+ conductivity type, the first region 104 and the third region 108 comprise a P+ conductivity type. According to some embodiments, the third region 108 comprises a source region. According to some embodiments, the third region 108 comprises a drain region.

According to some embodiments, the semiconductor arrangement 100 comprises a first gate insulator 110, second gate insulator 111, third gate insulator 112, and fourth gate insulator 113. In an embodiment, the gate insulators 110, 111, 112, 113 are disposed above and on top of the well region 102. The gate insulators 110, 111, 112, 113 are formed in any number of ways, such as by deposition, epitaxial growth, etc., for example. In some embodiments, the gate insulators 110, 111, 112, 113 comprise a dielectric material.

According to some embodiments, the semiconductor arrangement 100 comprises a first gate 120. In an embodiment, the first gate 120 is disposed on the first gate insulator 110 above the well region 102 on a first side 122 of the first region 104. In an embodiment, the first gate 120 is formed by deposition. In some embodiments, the first gate 120 selectively provides an electrical path to the first region 104. According to some embodiments, the first gate 120 comprises a conductive material, such as aluminum, copper, etc. In an embodiment, the first gate 120 comprises a first top surface 124 facing away from the well region 102.

According to some embodiments, the semiconductor arrangement 100 comprises a second gate 130. In an embodiment, the second gate 130 is disposed on the second gate insulator 111 above the well region 102 on a second side 132 of the first region 104. In an embodiment, the second gate 130 is formed by deposition. In some embodiments, the second gate 130 selectively provides an electrical path between the first region 104 and the second region 106. According to some embodiments, the second gate 130 comprises a conductive material, such as aluminum, copper, etc. In an embodiment, the second gate 130 comprises a second top surface 134 facing away from the well region 102.

According to some embodiments, the semiconductor arrangement 100 comprises a third gate 140. In an embodiment, the third gate 140 is disposed on the third gate insulator 112 above the well region 102 on a first side 142 of the third region 108. In an embodiment, the third gate 140 is formed by deposition. In some embodiments, the third gate 140 selectively provides an electrical path between the second region 106 and the third region 108. According to some embodiments, the third gate 140 comprises a conductive material, such as aluminum, copper, etc. In an embodiment, the third gate 140 comprises a third top surface 144 facing away from the well region 102.

According to some embodiments, the semiconductor arrangement 100 comprises a fourth gate 150. In an embodiment, the fourth gate 150 is disposed on the fourth gate insulator 113 above the well region 102 on a second side 152 of the third region 108. In an embodiment, the fourth gate 150 is formed by deposition. In some embodiments, the fourth gate 150 selectively provides an electrical path to the third region 108. According to some embodiments, the fourth gate 150 comprises a conductive material, such as aluminum, copper, etc. In an embodiment, the fourth gate 150 comprises a fourth top surface 154 facing away from the well region 102.

According to some embodiments, a dielectric layer 160 is formed over the well region 102, the regions 104, 106, 108, and the gates 120, 130, 140, 150. The dielectric layer 160 is formed in any number of ways, such as by chemical vapor deposition (CVD), high density plasma CVD (HDP-CVD), or other suitable methods, for example. The dielectric layer 160 comprises any number of materials, including, for example, oxides, silicon dioxide, etc., alone or in combination.

According to some embodiments, portions of the dielectric layer 160 are removed, such as by dry or wet etching, for example, to form one or more openings in the dielectric layer 160. In some embodiments, a first gate opening 162 is formed over the first gate 120 from an upper surface 161 of the dielectric layer 160 to the first top surface 124 of the first gate 120. In some embodiments, a first region opening 164 is formed over the first region 104 from the upper surface 161 of the dielectric layer 160 to the first region 104. In some embodiments, a second gate opening 166 is formed over the second gate 130 from the upper surface 161 to the second top surface 134 of the second gate 130. In some embodiments, a second region opening 168 is formed over the second region 106 from the upper surface 161 to the second region 106. In some embodiments, a third gate opening 170 is formed over the third gate 140 from the upper surface 161 to the third top surface 144 of the third gate 140. In some embodiments, a third region opening 172 is formed over the third region 108 from the upper surface 161 to the third region 108. In some embodiments, a fourth gate opening 174 is formed over the fourth gate 150 from the upper surface 161 to the fourth top surface 154 of the fourth gate 150.

Figure 2:
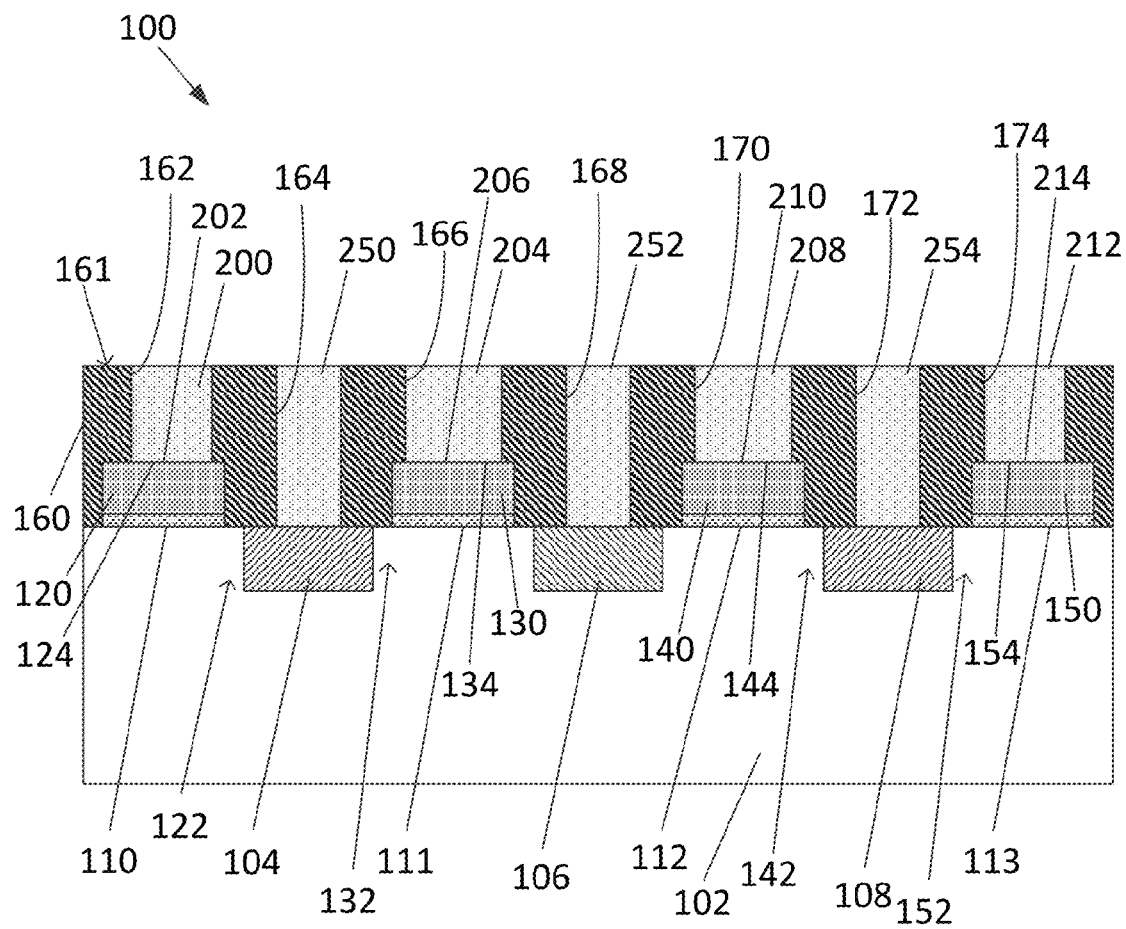
FIG. 2 illustrates forming contacts associated with fabricating a semiconductor arrangement, according to an embodiment.

FIG. 2 illustrates the formation of contacts within the openings 162, 164, 166, 168, 170, 172, 174, according to some embodiments. In some embodiments, a first gate contact 200 is formed within the first gate opening 162. In an embodiment, the first gate contact 200 is disposed above and on top of the first gate 120. According to some embodiments, the first gate contact 200 comprises a first bottom surface 202 facing towards the well region 102. In some embodiments, a second gate contact 204 is formed within the second gate opening 166. In an embodiment, the second gate contact 204 is disposed above and on top of the second gate 130. According to some embodiments, the second gate contact 204 comprises a second bottom surface 206 facing towards the well region 102.

In some embodiments, a third gate contact 208 is formed within the third gate opening 170. In an embodiment, the third gate contact 208 is disposed above and on top of the third gate 140. According to some embodiments, the third gate contact 208 comprises a third bottom surface 210 facing towards the well region 102. In some embodiments, a fourth gate contact 212 is formed within the fourth gate opening 174. In an embodiment, the fourth gate contact 212 is disposed above and on top of the fourth gate 150. According to some embodiments, the fourth gate contact 212 comprises a fourth bottom surface 214 facing towards the well region 102.

In some embodiments, the gate contacts 200, 204, 208, 212 comprise a conductive material. According to some embodiments, the gate contacts 200, 204, 208, 212 comprise tungsten, copper, aluminum, alone or in combination.

In some embodiments, a first region contact 250 is formed within the first region opening 164. In an embodiment, the first region contact 250 is disposed above and on top of the first region 104. According to some embodiments, a second region contact 252 is formed within the second region opening 168. In an embodiment, the second region contact 252 is disposed above and on top of the second region 106. According to some embodiments, a third region contact 254 is formed within the third region opening 172. In an embodiment, the third region contact 254 is disposed above and on top of the third region 108.

In some embodiments, the region contacts 250, 252, 254 comprise a conductive material. According to some embodiments, the region contacts 250, 252, 254 comprise tungsten, copper, aluminum, etc., alone or in combination. In some embodiments, the region contacts 250, 252, 254 comprise the same material as the gate contacts 200, 204, 208, 212, while in some embodiments, the region contacts 250, 252, 254 comprise a different material than the gate contacts 200, 204, 208, 212.

Figure 3:
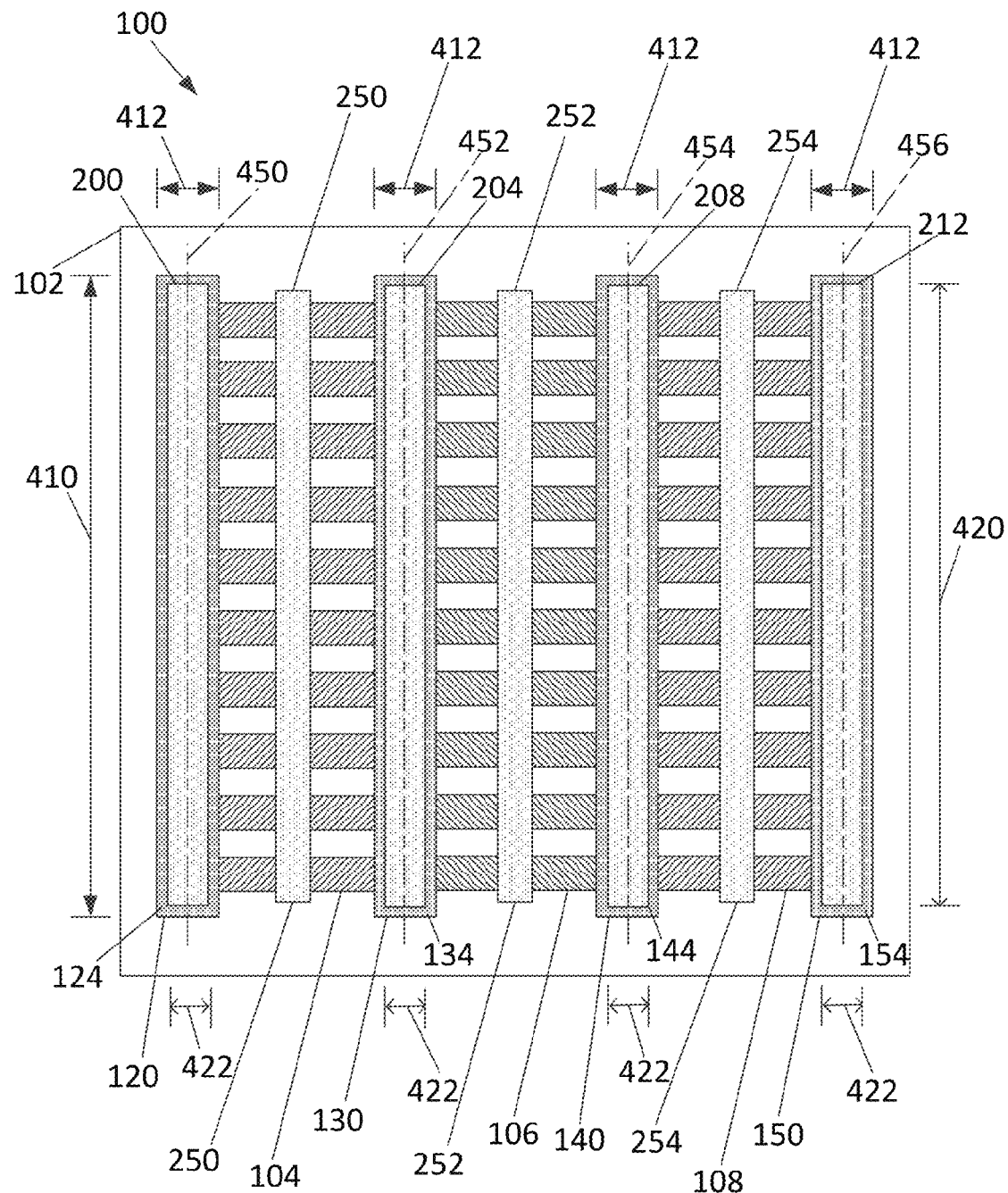
FIG. 3 illustrates a semiconductor arrangement, according to an embodiment.

FIG. 3 is a plan view illustrating the semiconductor arrangement 100, according to some embodiments. According to some embodiments, as illustrated in FIG. 2, the dielectric layer 160 covers portions of the well region 102, regions 104, 106, 108, gates 120, 130, 140, 150, etc. For illustrative purposes, however, to better show portions of the semiconductor arrangement 100, the dielectric layer 160 is not illustrated in FIG. 3. In an embodiment, the first top surface 124 of the first gate 120 comprises a first top surface area. In an embodiment, the second top surface 134 of the second gate 130 comprises a second top surface area. In an embodiment, the third top surface 144 of the third gate 140 comprises a third top surface area. In an embodiment, the fourth top surface 154 of the fourth gate 150 comprises a fourth top surface area. According to some embodiments, the top surface areas of the top surfaces 124, 134, 144, 154 comprise a product of a gate length 410 by a gate width 412.

In an embodiment, the first bottom surface 202 (illustrated in FIG. 2) of the first gate contact 200 comprises a first bottom surface area. In an embodiment, the second bottom surface 206 (illustrated in FIG. 2) of the second gate contact 204 comprises a second bottom surface area. In an embodiment, the third bottom surface 210 (illustrated in FIG. 2) of the third gate contact 208 comprises a third bottom surface area. In an embodiment, the fourth bottom surface 214 (illustrated in FIG. 2) of the fourth gate contact 212 comprises a fourth bottom surface area. According to some embodiments, the bottom surface areas of the bottom surfaces 202, 206, 210, 214 comprise a product of a contact length 420 by a contact width 422.

In some embodiments, the first bottom surface area covers at least about two thirds of the first top surface area. According to some embodiments, the first bottom surface area of the first gate contact 200 covers at least about three fourths of the first top surface area of the first gate 120. In some embodiments, the second, third, and fourth bottom surface areas cover at least about two thirds of the second, third, and fourth top surface areas, respectively. According to some embodiments, the second, third, and fourth bottom surface areas cover at least about three fourths of the second, third, and fourth top surface areas, respectively.

In an embodiment, the first gate contact 200 extends along a first gate axis 450 that is substantially parallel to a direction along which the first gate 120 extends. According to some embodiments, the first gate contact 200 extends substantially parallel with respect to the first gate 120. In some embodiments, the second gate contact 204 extends along a second gate axis 452 that is substantially parallel to a direction along which the second gate 130 extends. According to some embodiments, the third gate contact 208 extends along a third gate axis 454 that is substantially parallel to a direction along which the third gate 140 extends. According to some embodiments, the fourth gate contact 212 extends along a fourth gate axis 456 that is substantially parallel to a direction along which the fourth gate 150 extends.

Figure 4:
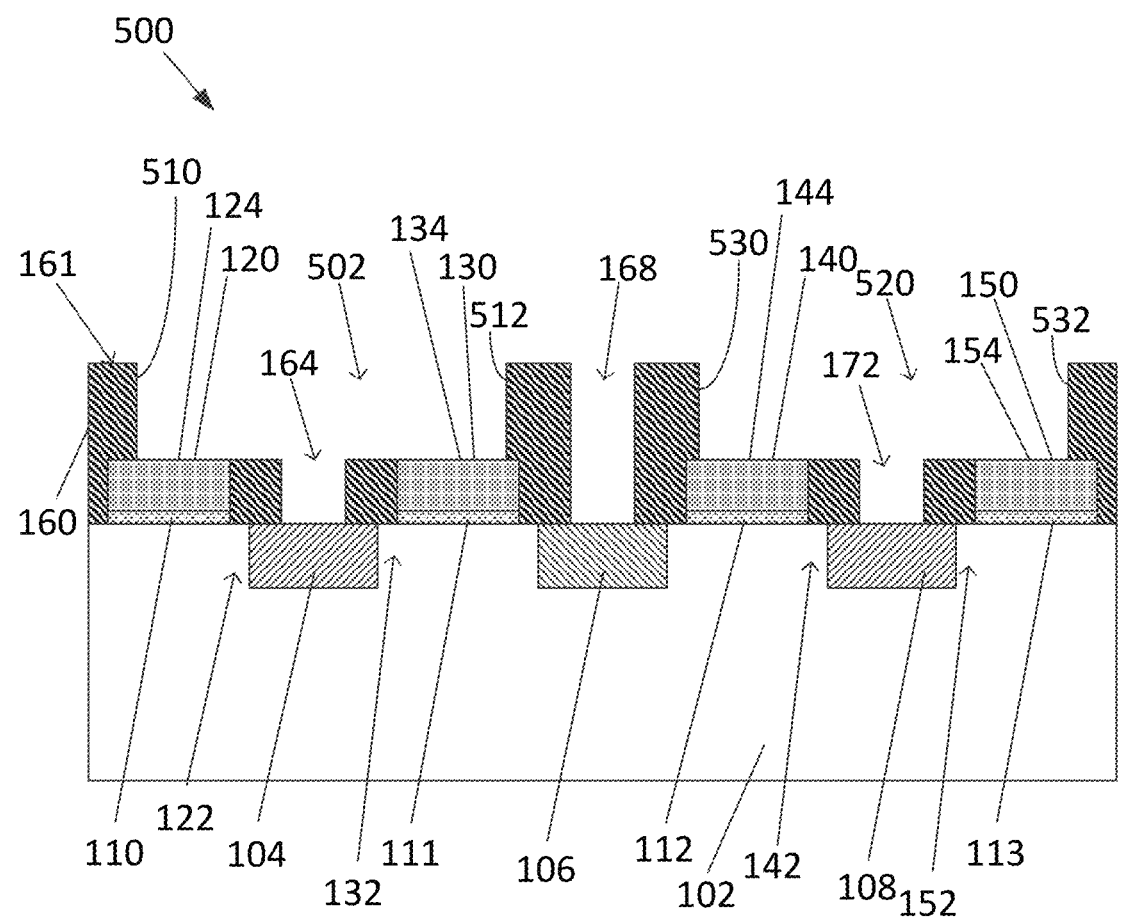
FIG. 4 illustrates a portion of a semiconductor arrangement, according to an embodiment.

FIG. 4 is a cross-sectional view illustrating a second example semiconductor arrangement 500. According to some embodiments, the second semiconductor arrangement 500 includes the well region 102, first region 104, second region 106, third region 108, first gate 120, second gate 130, third gate 140, fourth gate 150, first region opening 164, second region opening 168, and third region opening 172.

In some embodiments, portions of the dielectric layer 160 are removed, such as by dry or wet etching, to form one or more openings within the dielectric layer 160. In some embodiments, a first multi-gate opening 502 is formed over the first gate 120, first region 104, and the second gate 130. According to an embodiment, the first multi-gate opening 502 extends between a first dielectric surface 510 at a first end and a second dielectric surface 512 at a second end. In an embodiment, the first multi-gate opening 502 is formed above the first region opening 164.

In some embodiments, a second multi-gate opening 520 is formed over the third gate 140, third region 108, and fourth gate 150. According to an embodiment, the second multi-gate opening 520 extends between a third dielectric surface 530 at a first end and a fourth dielectric surface 532 at a second end. In an embodiment, the second multi-gate opening 520 is formed above the third region opening 172.

Figure 5:
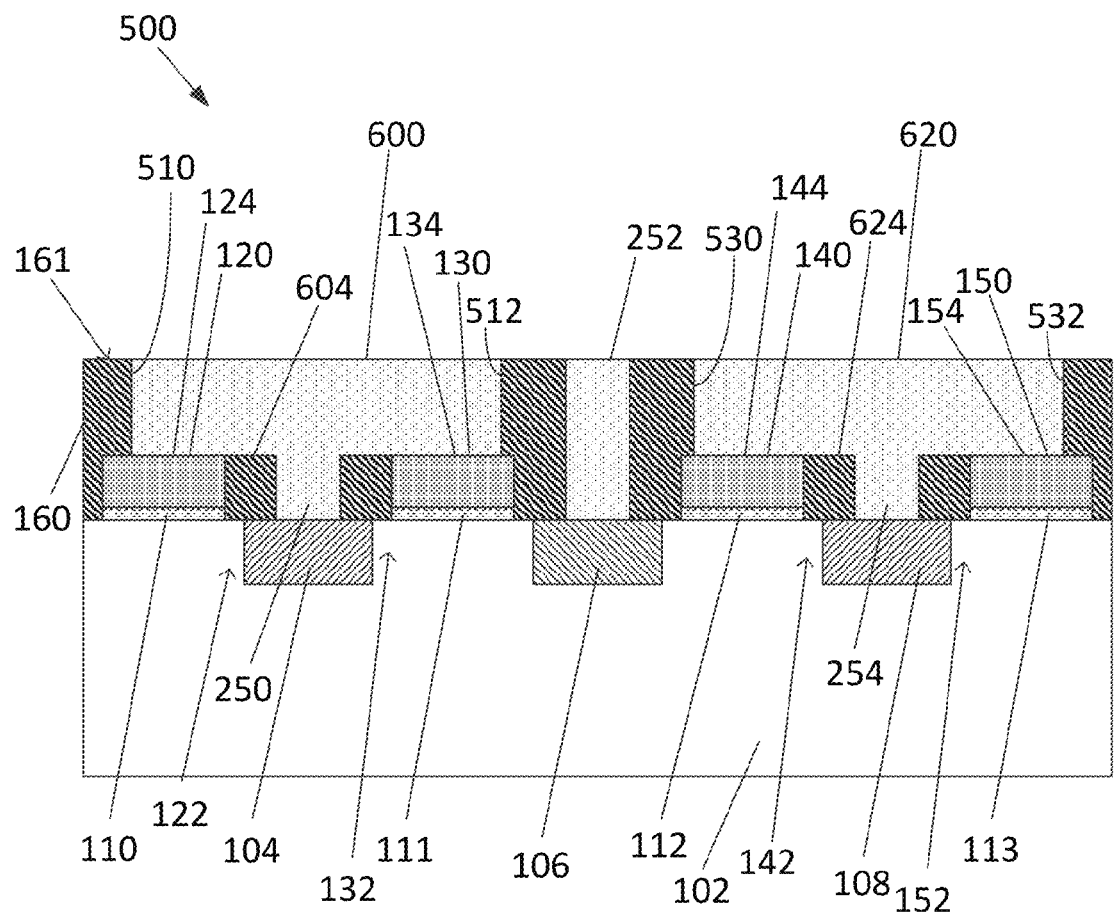
FIG. 5 illustrates forming contacts associated with fabricating a semiconductor arrangement, according to an embodiment.

FIG. 5 illustrates the formation of contacts within the openings 164, 168, 172, 502, 520, according to some embodiments. In some embodiments, the first region contact 250 is formed in the first region opening 164. According to some embodiments, the second region contact 252 is formed in the second region opening 168. In some embodiments, the third region contact 254 is formed in the third region opening 172.

According to some embodiments, a first multi-gate contact 600 is formed in the first multi-gate opening 502. In some embodiments, the first multi-gate contact 600 is disposed above and on top of the first gate 120, first region contact 250, and the second gate 130. According to some embodiments, the first multi-gate contact 600 comprises a first multi-gate bottom surface 604 facing towards the well region 102. In some embodiments, the first multi-gate bottom surface 604 of the first multi-gate contact 600 is in contact with the first region contact 250. According to some embodiments, the first multi-gate contact 600 is formed between the first gate 120 and the second gate 130.

According to some embodiments, a second multi-gate contact 620 is formed in the second multi-gate opening 520. In some embodiments, the second multi-gate contact 620 is disposed above and on top of the third gate 140, third region contact 254, and the fourth gate 150. According to some embodiments, the second multi-gate contact 620 comprises a second multi-gate bottom surface 624 facing towards the well region 102. In some embodiments, the second multi-gate bottom surface 624 of the second multi-gate contact 620 is in contact with the third region contact 254. According to some embodiments, the second multi-gate contact 620 is formed between the third gate 140 and the fourth gate 150.

In some embodiments, the first multi-gate contact 600 and the second multi-gate contact 620 comprise a conductive material. According to some embodiments, the first multi-gate contact 600 and the second multi-gate contact 620 comprise tungsten, copper, aluminum, polysilicon, etc., alone or in combination. In an embodiment, the first multi-gate contact 600 comprises the same material as the first region contact 250. In an embodiment, the second multi-gate contact 620 comprises the same material as the third region contact 254.

Figure 6:
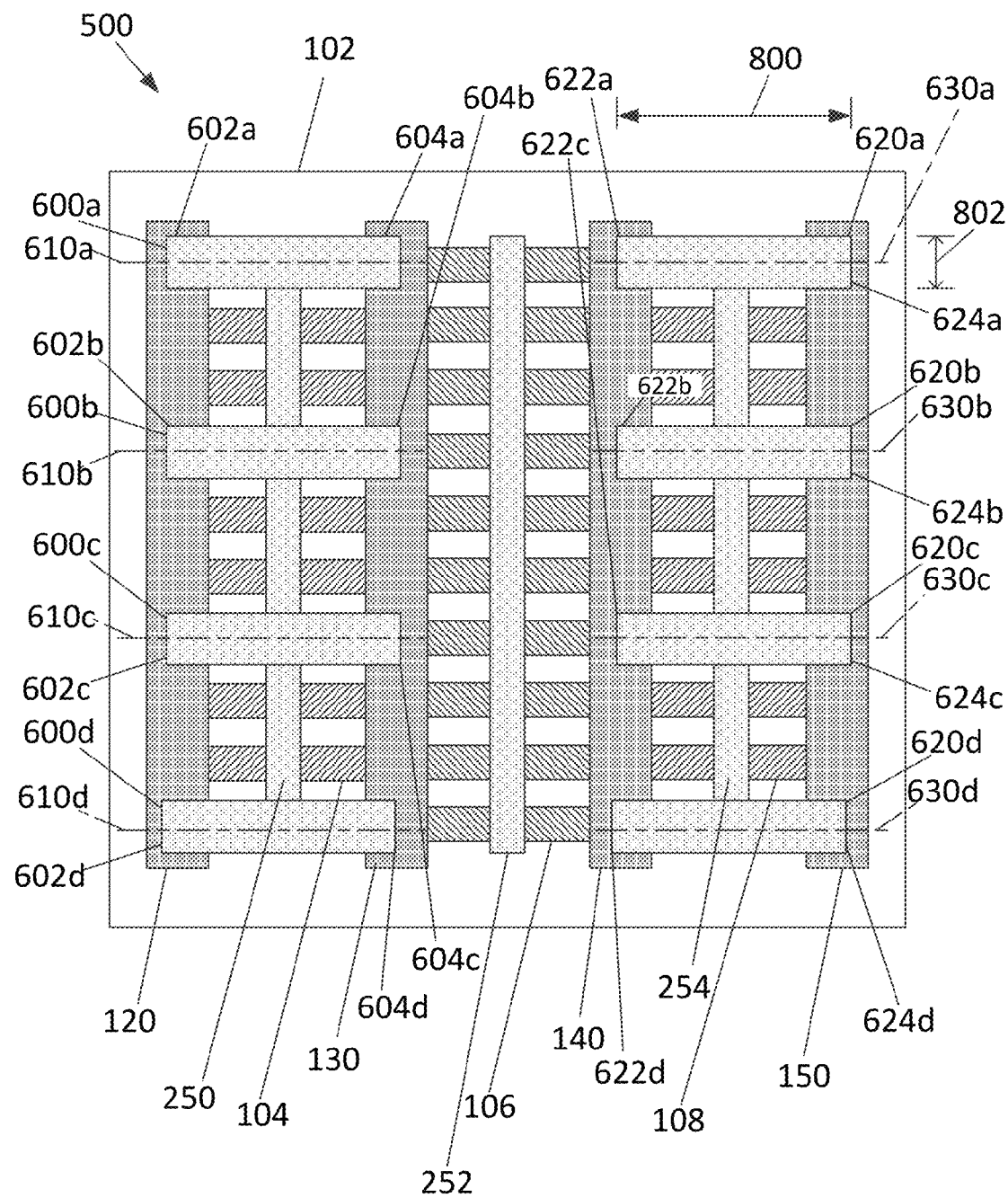
FIG. 6 illustrates a semiconductor arrangement, according to an embodiment.

FIG. 6 is a plan view illustrating the second semiconductor arrangement 500, according to some embodiments. According to some embodiments, as illustrated in FIG. 5, the dielectric layer 160 covers portions of the well region 102, regions 104, 106, 108, gates 120, 130, 140, 150, etc. For illustrative purposes, however, to better show portions of the second semiconductor arrangement 500, the dielectric layer 160 is not illustrated in FIG. 6. In an embodiment, the first multi-gate contacts 600a, 600b, 600c, 600d extend between a first end 602a, 602b, 602d and a second end 604a, 604b, 604c, 604d. In some embodiments, the first end 602a, 602b, 602c, 602d is disposed above and in contact with the first gate 120. In some embodiments, the second end 604a, 604b, 604c, 604d is disposed above and in contact with the second gate 130. The first multi-gate contacts 600a, 600b, 600c, 600d are illustrated as comprising four multi-gate contacts, but, according to some embodiments, the second semiconductor arrangement 500 includes any number of first multi-gate contacts.

In some embodiments, the first multi-gate contacts 600a, 600b, 600c, 600d extend along a first multi-gate axis 610a, 610b, 610c, 610d. According to some embodiments, the first multi-gate axis 610a, 610b, 610c, 610d is substantially perpendicular to a direction along which at least one of the first gate 120 or the second gate 130 extend. In an embodiment, the first multi-gate axis 610a, 610b, 610c, 610d is substantially perpendicular to a direction along which the first gate 120 extends, while being non-perpendicular to a direction along which the second gate 130 extends. In an embodiment, the first multi-gate axis 610a, 610b, 610c, 610d is substantially perpendicular to a direction along which the second gate 130 extends, while being non-perpendicular to a direction along which the first gate 120 extends.

In an embodiment, the first multi-gate bottom surface 604 (illustrated in FIG. 5) of the first multi-gate contacts 600a, 600b, 600c, 600d comprises a first multi-gate bottom surface area. In an embodiment, the first multi-gate bottom surface area comprises at least about one fifth of at least one of the first top surface area of the first gate 120 or the second top surface area of the second gate 130. According to some embodiments, the first multi-gate bottom surface areas of the first multi-gate contacts 600a, 600b, 600c, 600d comprise a product of a contact length 800 by a contact width 802.

In an embodiment, the second multi-gate contacts 620a, 620b, 620c, 620d extend between a first end 622a, 622b, 622c, 622d and a second end 624a, 624b, 624c, 624d. In some embodiments, the first end 622a, 622b, 622c, 622d is disposed above and in contact with the third gate 140. In some embodiments, the second end 624a, 624b, 624c, 624d is disposed above and in contact with the fourth gate 150. The second multi-gate contacts 620a, 620b, 620c, 620d are illustrated as comprising four multi-gate contacts, but according to some embodiments, the second semiconductor arrangement 500 includes any number of second multi-gate contacts.

In some embodiments, the second multi-gate contacts 620a, 620b, 620c, 620d extend along a second multi-gate axis 630a, 630b, 630c, 630d. According to some embodiments, the second multi-gate axis 630a, 630b, 630c, 630d is substantially perpendicular to a direction along which at least one of the third gate 140 or the fourth gate 150 extend. In an embodiment, the second multi-gate axis 630a, 630b, 630c, 630d is substantially perpendicular to a direction along which the third gate 140 extends, while being non-perpendicular to a direction along which the fourth gate 150 extends. In an embodiment, the second multi-gate axis 630a, 630b, 630c, 630d is substantially perpendicular to a direction along which the fourth gate 150 extends, while being non-perpendicular to a direction along which the third gate 140 extends.

In an embodiment, the second multi-gate bottom surface 624 (illustrated in FIG. 5) of the second multi-gate contacts 620a, 620b, 620c, 620d comprises a second multi-gate bottom surface area. In an embodiment, the second multi-gate bottom surface area comprises at least about one fifth of at least one of the third top surface area of the third gate 140 or the fourth top surface area of the second gate 130. According to some embodiments, the second multi-gate bottom surface areas of the second multi-gate contacts 620a, 620b, 620c, 620d comprise a product of the contact length 800 by the contact width 802.

Figure 7:
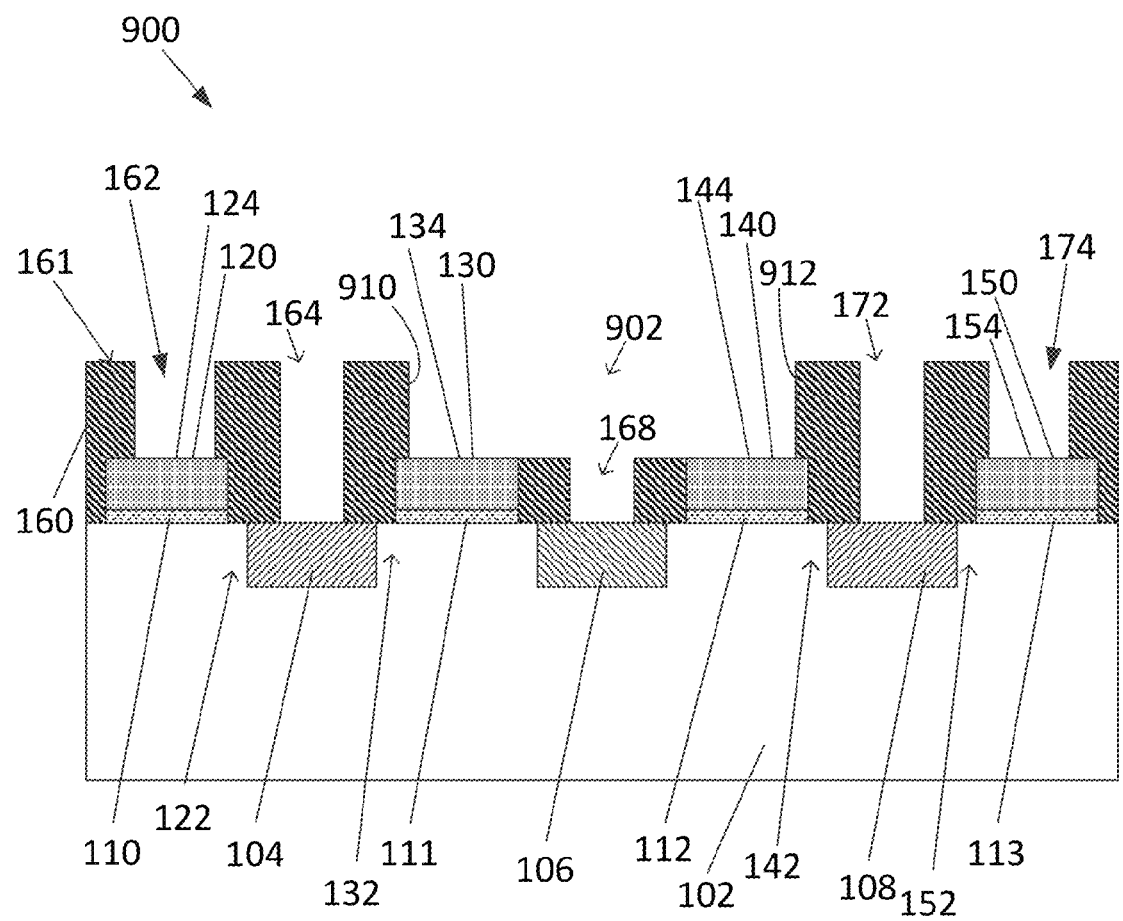
FIG. 7 illustrates a portion of a semiconductor arrangement, according to an embodiment.

FIG. 7 is a cross-sectional view illustrating a third example semiconductor arrangement 900. According to some embodiments, the third semiconductor arrangement 900 includes the well region 102, first region 104, second region 106, third region 108, first gate 120, second gate 130, third gate 140, fourth gate 150, first region opening 164, second region opening 168, and the third region opening 172.

In some embodiments, portions of the dielectric layer 160 are removed, such as by dry or wet etching, to form one or more openings within the dielectric layer 160. In some embodiments, a third multi-gate opening 902 is formed over the second gate 130, second region 106, and the third gate 140. According to an embodiment, the third multi-gate opening 902 extends between a first dielectric surface 910 at a first end and a second dielectric surface 912 at a second end. In an embodiment, the third multi-gate opening 902 is formed above the second region opening 168.

Figure 8:
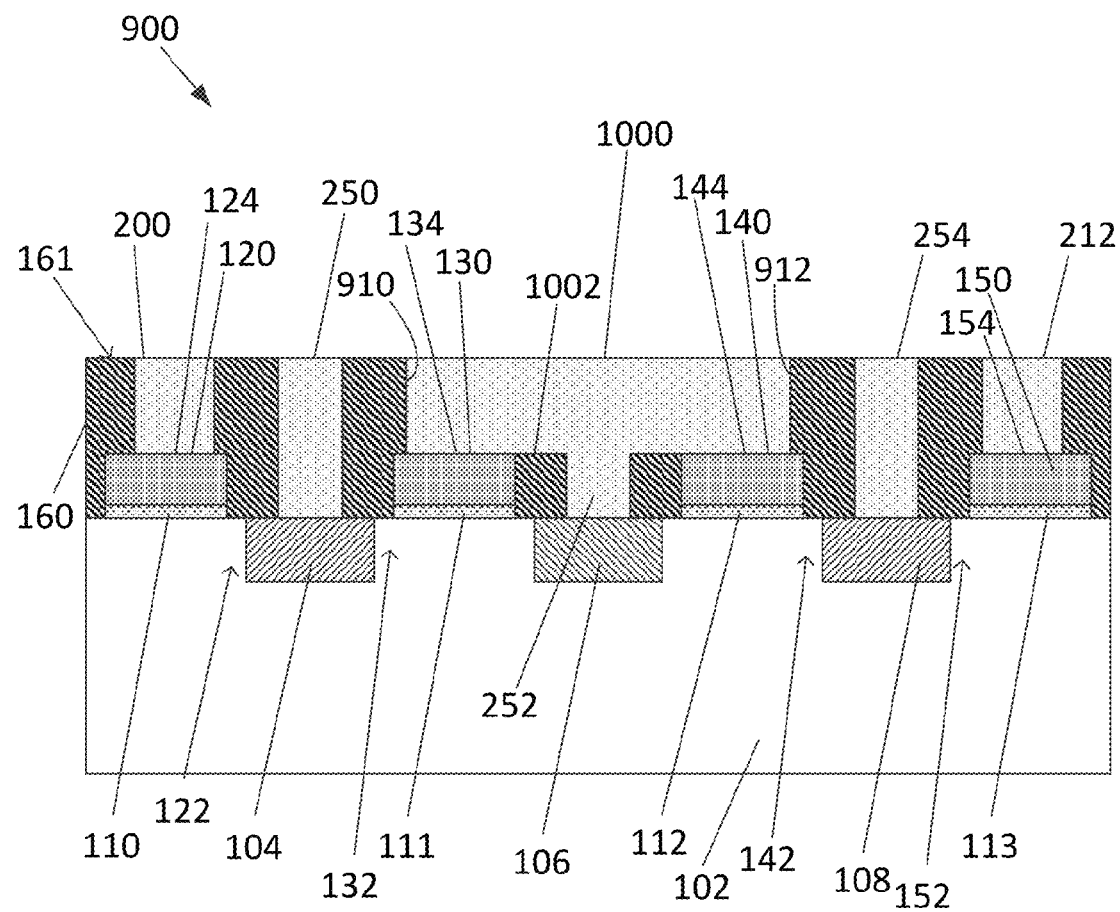
FIG. 8 illustrates forming contacts associated with fabricating a semiconductor arrangement, according to an embodiment.

FIG. 8 illustrates the formation of contacts within the openings 162, 164, 168, 172, 174, 902. In some embodiments, the first gate contact 200 is formed in the first gate opening 162. In some embodiments, the first region contact 250 is formed in the first region opening 164. In some embodiments, the second region contact 252 is formed in the second region opening 168. In some embodiments, the third region contact 254 is formed in the third region opening 172. In some embodiments, the fourth gate contact 212 is formed in the fourth gate opening 174.

According to some embodiments, a third multi-gate contact 1000 is formed in the third multi-gate opening 902. In some embodiments, the third multi-gate contact 1000 is disposed above and on top of the second gate 130, second region contact 252, and the third gate 140. According to some embodiments, the third multi-gate contact 1000 comprises a third multi-gate bottom surface 1002 facing towards the well region 102. In some embodiments, the third multi-gate bottom surface 1002 of the third multi-gate contact 1000 is in contact with the second region contact 252. In some embodiments, the third multi-gate contact 1000 comprises a conductive material. According to some embodiments, the third multi-gate contact 1000 comprises tungsten, copper, aluminum, etc., alone or in combination. In an embodiment, the third multi-gate contact 1000 comprises the same material as the second region contact 252. According to some embodiments, the third multi-gate contact 1000 is formed between the second gate 130 and the third gate 140.

Figure 9:
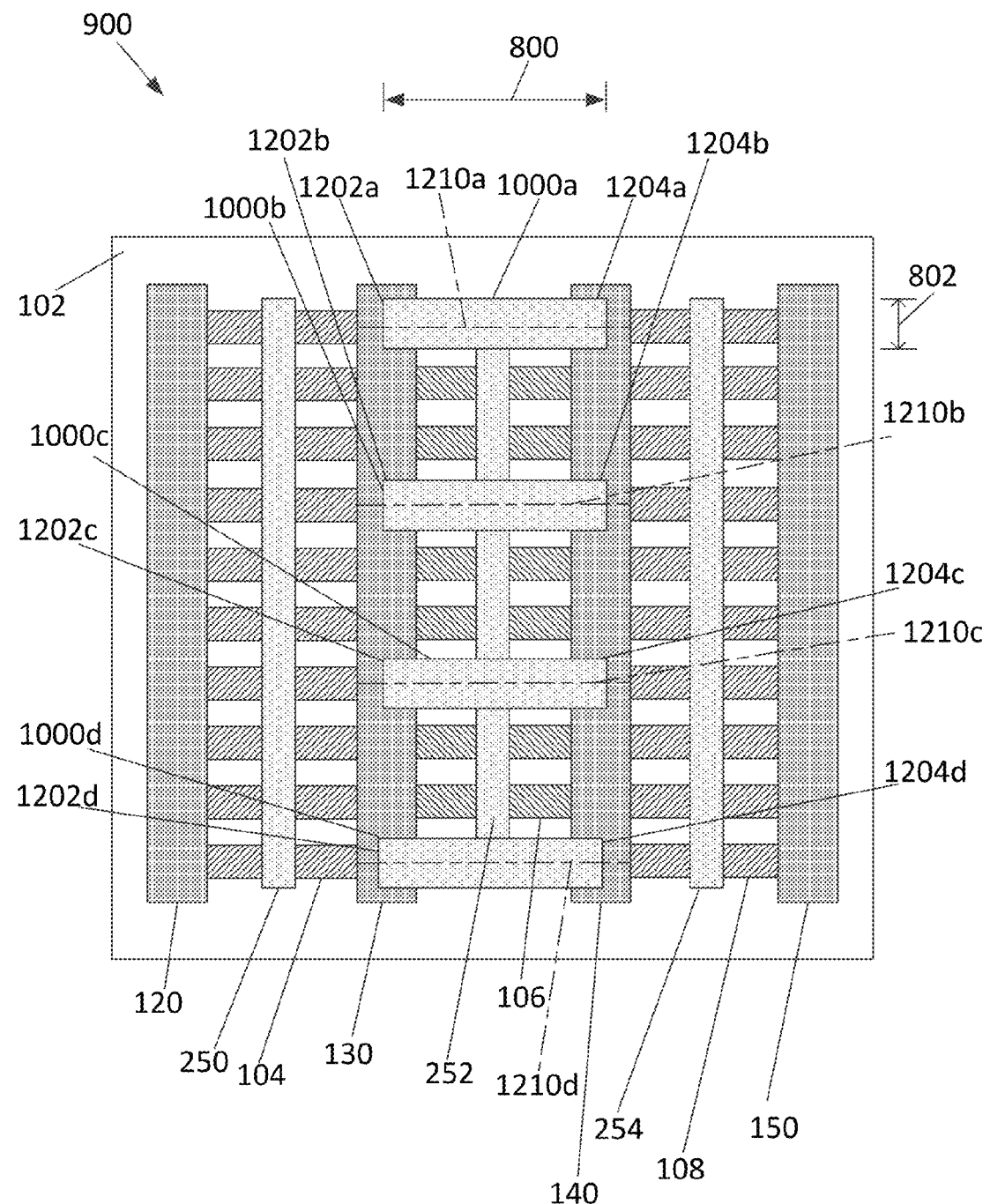
FIG. 9 illustrates a semiconductor arrangement, according to an embodiment.

FIG. 9 is a plan view illustrating the third semiconductor arrangement 900, according to some embodiments. According to some embodiments, as illustrated in FIG. 8, the dielectric layer 160 covers portions of the well region 102, regions 104, 106, 108, gates 120, 130, 140, 150, etc. For illustrative purposes, however, to better show portions of the third semiconductor arrangement 900, the dielectric layer 160 is not illustrated in FIG. 9. In an embodiment, the third multi-gate contacts 1000a, 1000b, 1000c, 1000d extend between a first end 1202a, 1202b, 1202c, 1202d and a second end 1204a, 1204b, 1204c, 1204d. In some embodiments, the first end 1202a, 1202b, 1202c, 1202d is disposed above and in contact with the second gate 130. In some embodiments, the second end 1204a, 1204b, 1204c, 1204d is disposed above and in contact with the third gate 140. The third multi-gate contacts 1000a, 1000b, 1000c, 1000d are illustrated as comprising four multi-gate contacts, but, according to some embodiments, the third semiconductor arrangement 900 includes any number of third multi-gate contacts.

In some embodiments, the third multi-gate contacts 1000a, 1000b, 1000c, 1000d extend along a third multi-gate axis 1210a, 1210b, 1210c, 1210d. According to some embodiments, the third multi-gate axis 1210a, 1210b, 1210c, 1210d is substantially perpendicular to a direction along which at least one of the second gate 130 or third gate 140 extend. In an embodiment, the third multi-gate axis 1210a, 1210b, 1210c, 1210d is substantially perpendicular to a direction along which the second gate 130 extends, while being non-perpendicular to a direction along which the third gate 140 extends. In an embodiment, the third multi-gate axis 1210a, 1210b, 1210c, 1210d is substantially perpendicular to a direction along which the third gate 140 extends, while being non-perpendicular to a direction along which the second gate 130 extends.

In an embodiment, the third multi-gate bottom surface 1002 (illustrated in FIG. 8) of the third multi-gate contacts 1000a, 1000b, 1000c, 1000d comprises a third multi-gate bottom surface area. In an embodiment, the third multi-gate bottom surface area comprises at least about one fifth of at least one of the second top surface area of the second gate 130 or the third top surface area of the third gate 140. According to some embodiments, the third multi-gate bottom surface areas of the third multi-gate contacts 1000a, 1000b, 1000c, 1000d comprise a product of the contact length 800 by the contact width 802.

Figure 10:
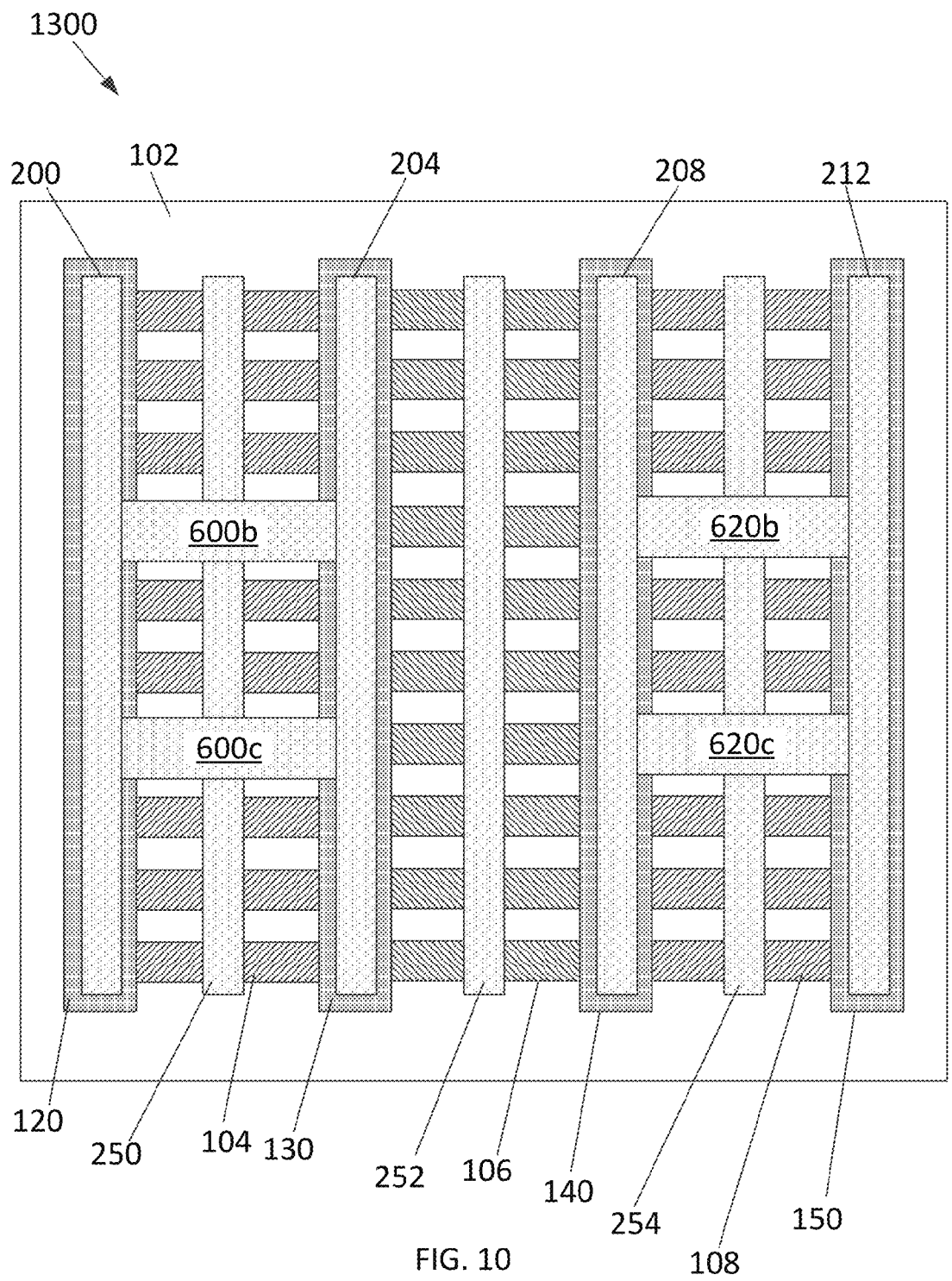
FIG. 10 illustrates a semiconductor arrangement, according to an embodiment.

FIG. 10 is a plan view illustrating a fourth example semiconductor arrangement 1300. According to some embodiments, the dielectric layer 160 covers portions of the well region 102, regions 104, 106, 108, gates 120, 130, 140, 150, etc. For illustrative purposes, however, to better show portions of the fourth semiconductor arrangement 1300, the dielectric layer 160 is not illustrated in FIG. 10. In an embodiment, the fourth semiconductor arrangement 1300 includes the first gate contact 200, second gate contact 204, third gate contact 208, fourth gate contact 212 and first multi-gate contacts 600b, 600c and second multi-gate contacts 620b, 620c. In some embodiments, the first gate contact 200, second gate contact 204, third gate contact 208, fourth gate contact 212 are formed in generally the same way as described above with respect to FIGS. 1 to 3. In some embodiments, the first multi-gate contacts 600b, 600c and second multi-gate contacts 620b, 620c are formed in generally the same way as described above with respect to FIGS. 4 to 6.

According to some embodiments, the first multi-gate contacts 600b, 600c are disposed between the first gate contact 200 and the second gate contact 204. In an embodiment, the first multi-gate contacts 600b, 600c comprise a portion of the first gate contact 200 and the second gate contact 204. According to some embodiments, the second multi-gate contacts 620b, 620c are disposed between the third gate contact 208 and the fourth gate contact 212. In an embodiment, the second multi-gate contacts 620b, 620c comprise a portion of the third gate contact 208 and the fourth gate contact 212.

According to some embodiments, the gate contacts 200, 204, 208, 212, the first multi-gate contacts 600b, 600c, and the second multi-gate contacts 620b, 620c improve thermal conductivity of the fourth semiconductor arrangement 1300. In some embodiments, heat generated in the gates 120, 130, 140, 150, the first region 104, or the third region 108 is dissipated through the gate contacts 200, 204, 208, 212, the first multi-gate contacts 600b, 600c, and the second multi-gate contacts 620b, 620c.

Figure 11:
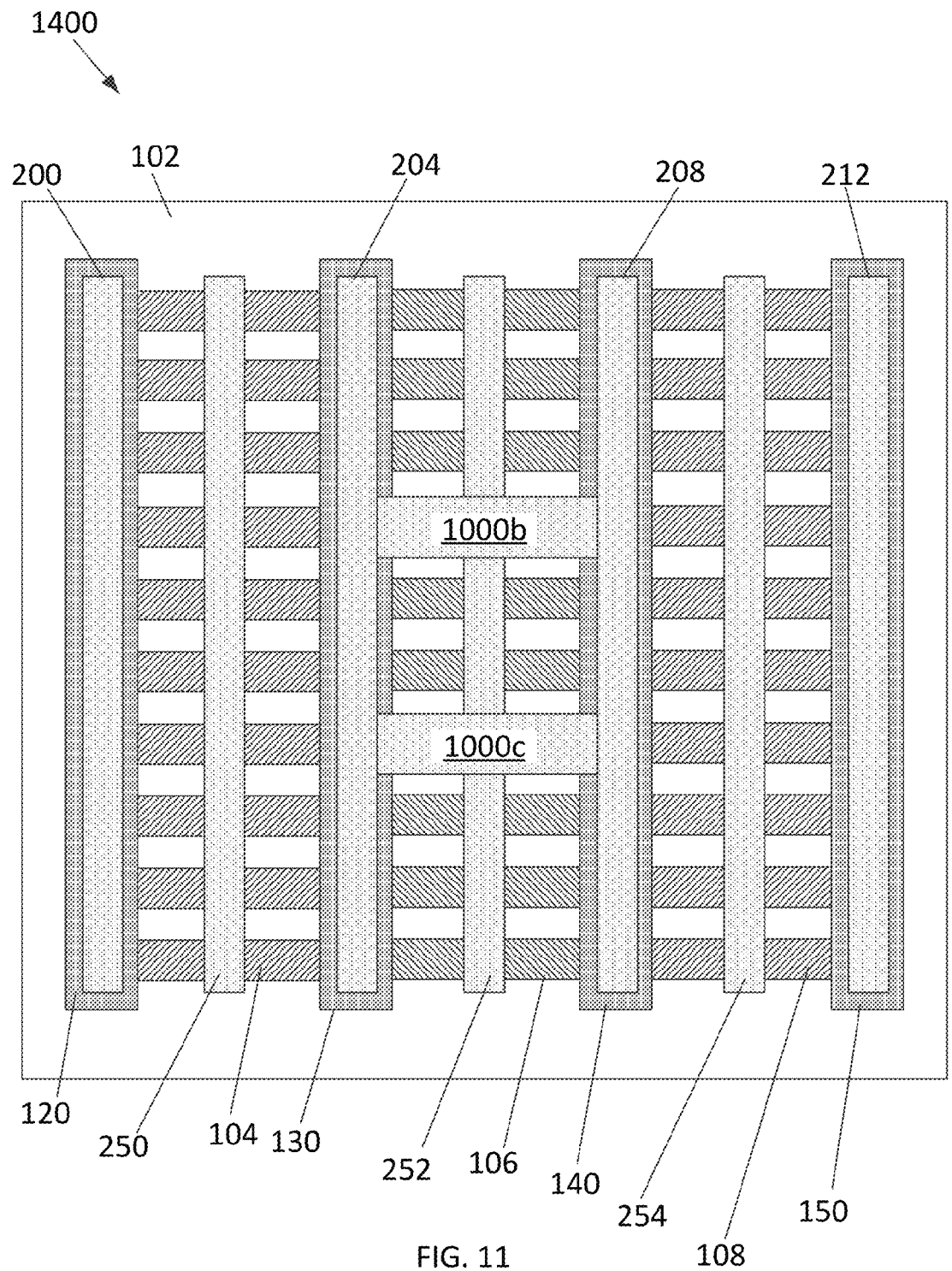
FIG. 11 illustrates a semiconductor arrangement, according to an embodiment.
Figure 12:
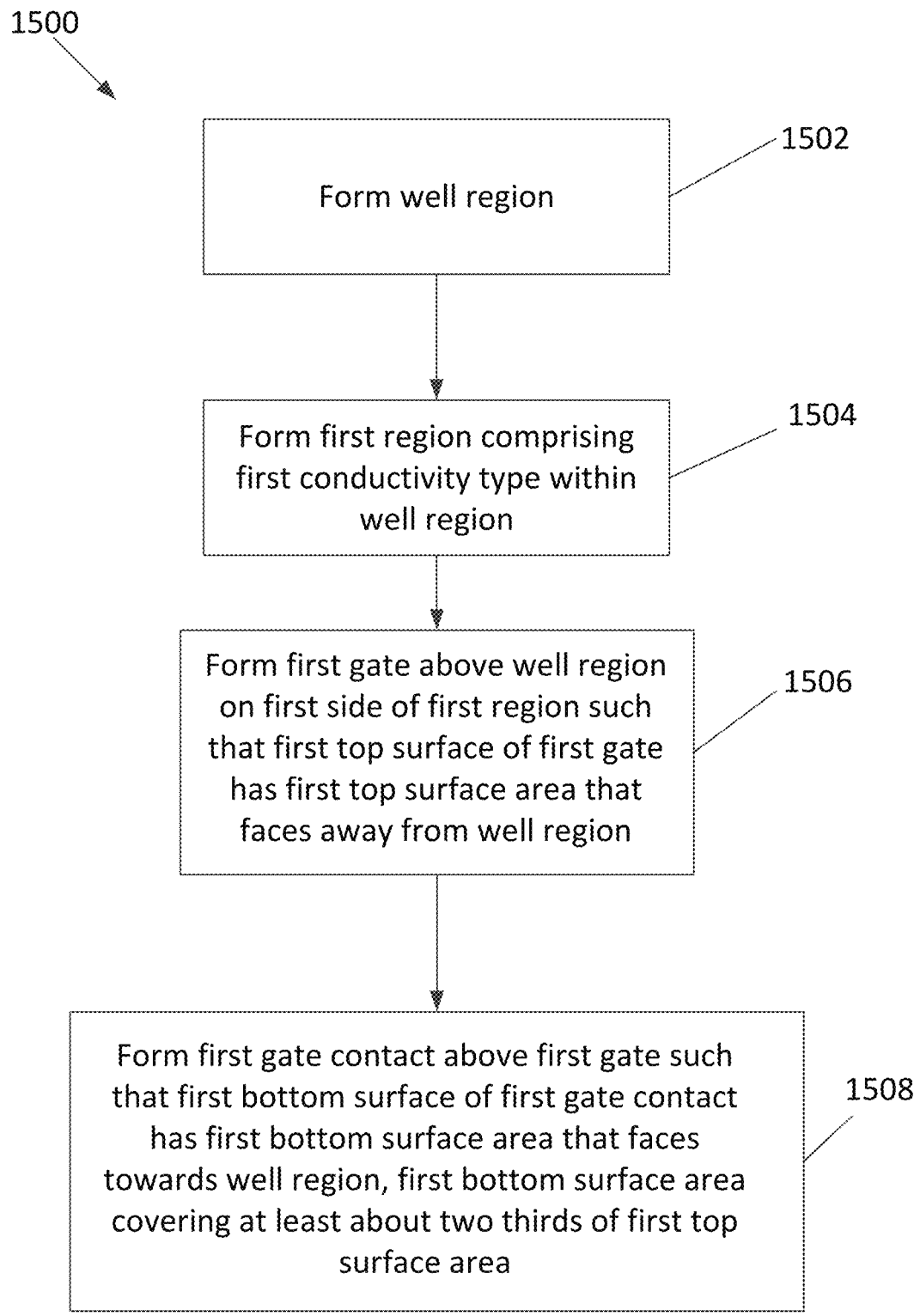
FIG. 12 illustrates a method of fabricating a semiconductor arrangement, according to an embodiment.

FIG. 11 is a plan view illustrating a fifth example semiconductor arrangement 1400. According to some embodiments, the dielectric layer 160 covers portions of the well region 102, regions 104, 106, 108, gates 120, 130, 140, 150, etc. For illustrative purposes, however, to better show portions of the fifth semiconductor arrangement 1400, the dielectric layer 160 is not illustrated in FIG. 11. In an embodiment, the fifth semiconductor arrangement 1400 includes the first gate contact 200, second gate contact 204, third gate contact 208, fourth gate contact 212 and third multi-gate contacts 1000b, 1000c. In some embodiments, the first gate contact 200, second gate contact 204, third gate contact 208, and fourth gate contact 212 are formed in generally the same way as described above with respect to FIGS. 1 to 3. In some embodiments, the third multi-gate contacts 1000b, 1000c are formed in generally the same way as described above with respect to FIGS. 7 to 9.

According to some embodiments, the third multi-gate contacts 1000b, 1000c are disposed between the second gate contact 204 and the third gate contact 208. In an embodiment, the third multi-gate contacts 1000b, 1000c comprise a portion of the second gate contact 204 and the third gate contact 208.

According to some embodiments, the gate contacts 200, 204, 208, 212, and the third multi-gate contacts 1000b, 1000c improve thermal conductivity of the fifth semiconductor arrangement 1400. In some embodiments, heat generated in the second gate 130, third gate 140, and the second region 106 is dissipated through the second gate contact 204, third gate contact 208, and the third multi-gate contacts 1000b, 1000c. It will be appreciated that improved thermal conductivity is also afforded by one or more of the foregoing embodiments. Also, the instant application, including the scope of the claims, is not to be limited by the examples illustrated, such as to two multi-gate contacts, four gate contacts, etc. Rather, any number of such features, elements, etc. are contemplated.

An example method 1500 of forming a semiconductor arrangement, such as at least one of 100, 500, 900, 1300, or 1400, according to some embodiments, is illustrated in FIG.

12. At 1502, the well region 102 is formed. At 1504, the first region 104 comprising the first conductivity type is formed within the well region 102. At 1506, the first gate 120 is formed above the well region 102 on the first side 122 of the first region 104 such that the first top surface 124 of the first gate 120 has the first top surface area that faces away from the well region 102. At 1508, the first gate contact 200 is formed above the first gate 120 such that the first bottom surface 202 of the first gate contact 200 has the first bottom surface area that faces towards the well region 102, the first bottom surface area covering at least about two thirds of the first top surface area.

In an embodiment, a semiconductor arrangement comprises a well region and a first region disposed within the well region. The first region comprises a first conductivity type. In an embodiment, a first gate is disposed above the well region on a first side of the first region. The first gate comprises a first top surface facing away from the well region. The first top surface has a first top surface area. In an embodiment, a first gate contact is disposed above the first gate. The first gate contact comprises a first bottom surface facing towards the well region. The first bottom surface has a first bottom surface area. The first bottom surface area covers at least about two thirds of the first top surface area.

In an embodiment, a semiconductor arrangement comprises a well region and a first region disposed within the well region. The first region comprises a first conductivity type. In an embodiment, the semiconductor arrangement comprises a first gate disposed above the well region on a first side of the first region. In an embodiment, the semiconductor arrangement comprises a second gate disposed above the well region on a second side of the first region. In an embodiment, the semiconductor arrangement comprises a first multi-gate contact disposed above and in contact with the first gate and the second gate.

In an embodiment, a method of fabricating a semiconductor arrangement comprises forming a well region. In an embodiment, the method comprises forming a first region comprising a first conductivity type within the well region. In an embodiment, the method comprises forming a first gate above the well region on a first side of the first region such that a first top surface of the first gate has a first top surface area that faces away from the well region. In an embodiment, the method comprises forming a first gate contact above the first gate such that a first bottom surface of the first gate contact has a first bottom surface area that faces towards the well region, the first bottom surface area covering at least about two thirds of the first top surface area.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first gate and a second gate generally correspond to gate A and gate B or two different or two identical gates or the same gate.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:
1. A semiconductor arrangement comprising:
a well region;
a first region disposed within the well region and comprising a first conductivity type;
a second region disposed within the well region and comprising the first conductivity type, the second region spaced apart from the first region;
a third region disposed within the well region;
a fourth region disposed within the well region;
a first gate disposed above the well region on a first side of the first region, the second region, the third region, and the fourth region;
a second gate disposed above the well region on a second side of the first region and the second region and on the first side of the third region and the fourth region, wherein:

the first region and the third region are shared by the second gate such that the second gate selectively provides a first electrical path between the first region and the third region, and the second region and the fourth region are shared by the second gate such that the second gate selectively provides a second electrical path between the second region and the fourth region;

a first region contact disposed above the first region and the second region;

a second region contact disposed above the third region and the fourth region; and a first multi-gate contact disposed above and in direct, physical contact with the first gate, the second gate, and the first region contact.

2. The semiconductor arrangement of claim 1, comprising a first gate insulator between the well region and the first gate, wherein a height of the first region contact is substantially equal to a combined height of the first gate insulator and the first gate.

3. The semiconductor arrangement of claim 1, wherein the first region contact is in direct, physical contact with the first region and the second region.

4. The semiconductor arrangement of claim 3, wherein the second region contact is in direct, physical contact with the third region and the fourth region.

5. The semiconductor arrangement of claim 1, wherein the first region corresponds to a first source region and the second region corresponds to a second source region.

6. The semiconductor arrangement of claim 1, wherein the first region corresponds to a first drain region and the second region corresponds to a second drain region.

7. The semiconductor arrangement of claim 1, wherein the third region comprises a second conductivity type different than the first conductivity type.

8. The semiconductor arrangement of claim 1, wherein:
a top surface of the well region lies in a plane, the first multi-gate contact extends along a first axis parallel to the plane,
the first gate extends along a second axis parallel to the plane, and
the second axis is substantially perpendicular to the first axis.

9. The semiconductor arrangement of claim 1, wherein the well region comprises the first conductivity type.

10. The semiconductor arrangement of claim 1, wherein the third region and the fourth region comprise a second conductivity type different than the first conductivity type.

11. A semiconductor arrangement comprising:
a well region;
a first region disposed within the well region and comprising a first conductivity type;
a second region disposed within the well region and comprising the first conductivity type;
a first gate disposed above the well region on a first side of the first region and the second region;
a second gate disposed above the well region on a second side of the first region and the second region;
a first region contact disposed above the first region and the second region; and
a first multi-gate contact disposed above the first gate, the second gate, and the first region contact, wherein the first multi-gate contact is not disposed above the second region.

12. The semiconductor arrangement of claim 11, wherein the first region contact is in direct, physical contact with the first region and the second region.

13. The semiconductor arrangement of claim 11, comprising a third region disposed within the well region and comprising a second conductivity type different than the first conductivity type, wherein the second gate is disposed between the first region and the third region and shared by the first region and the third region such that the second gate selectively provides a first electrical path between the first region and the third region.

14. The semiconductor arrangement of claim 11, wherein the first multi-gate contact is in direct, physical contact with the first gate, the second gate, and the first region contact.

15. The semiconductor arrangement of claim 11, wherein:
the first gate has a first top surface facing away from the well region, the first top surface having a first top surface area; and
the first multi-gate contact has a first multi-gate bottom surface facing towards the well region, the first multi-gate bottom surface having a first multi-gate bottom surface area, the first multi-gate bottom surface area at least about one fifth of the first top surface area.

16. The semiconductor arrangement of claim 11, wherein:
a top surface of the well region lies in a plane,
the first multi-gate contact extends along a first axis parallel to the plane,
the first gate extends along a second axis parallel to the plane, and
the second axis is substantially perpendicular to the first axis.

17. The semiconductor arrangement of claim 11, wherein a first end of the first multi-gate contact overlies the first gate and a second end of the first multi-gate contact overlies the second gate.

18. A semiconductor arrangement comprising:
a well region;
a first region disposed within the well region and comprising a first conductivity type;
a second region disposed within the well region and comprising the first conductivity type;
a third region disposed within the well region and comprising a second conductivity type different than the first conductivity type;
a first gate disposed above the well region on a first side of the first region, the second region, and the third region;
a second gate disposed above the well region on a second side of the first region and the second region and on the first side of the third region, wherein the first region and the third region are shared by the second gate such that the second gate selectively provides a first electrical path between the first region and the third region;
a first region contact disposed above the first region and the second region;
a dielectric region disposed between the first region contact and the first gate; and
a first multi-gate contact disposed above and in direct, physical contact with the first gate, the second gate, and the first region contact.

19. The semiconductor arrangement of claim 18, wherein the dielectric region is in direct, physical contact with the well region.

20. The semiconductor arrangement of claim 18, wherein the first multi-gate contact is disposed above and in direct, physical contact with the dielectric region.

* * * * *